(12) United States Patent  (10) Patent No.: US 6,301,171 B2
Kim et al.                       (45) Date of Patent:    Oct. 9, 2001

(54) SEMICONDUCTOR MEMORY DEVICE CAPABLE OF REDUCING DATA TEST TIME IN PIPELINE

(75) Inventors: Tae-hyun Kim, Seoul; Hyung-dong Kim, Suwon, both of (KR)

(73) Assignee: Samsung Electronics Co., Ltd. (KR)

( * ) Notice: Subject to any disclaimer, the term of this patent is extended or adjusted under 35 U.S.C. 154(b) by 18 days.

(21) Appl. No.: 09/767,481

(22) Filed: Jan. 23, 2001

(Under 37 CFR 1.47)

(30) Foreign Application Priority Data

Jan. 31, 2000 (KR) ................................................... 00-4675

(51) Int. Cl.[7] .................................................. G11C 29/00
(52) U.S. Cl. ................ 365/201; 365/189.07; 365/189.02; 365/233; 365/230.03
(58) Field of Search ............................... 365/201, 189.07, 365/233, 230.03, 189.02

(56) References Cited

U.S. PATENT DOCUMENTS 5,973,981 * 10/1999 Lee ................................... 365/230.01
6,144,598 * 11/2000 Cooper et al. ........................ 365/201

* cited by examiner

Primary Examiner—Andrew Q. Tran
(74) Attorney, Agent, or Firm—F. Chau & Associates, LLP (57) ABSTRACT

A semiconductor memory device capable of reducing a data test time in a pipeline is provided. The semiconductor memory device has a pad, data lines, and a data port (DQ) block including a plurality of memory cells. The semiconductor memory device includes a pipeline adapted to output data from selected memory cells of the plurality of memory cells in the DQ block to the pad via the data lines. The pipeline includes a plurality of unit pipeline cells (UPLs) connected in a series. Each of the UPLs is further connected to each of the data lines and is adapted to latch the data, wherein the data is transmitted to a subsequent UPL in the series, if any, so as to sequentially transmit the data to the pad. A comparison controller is connected to a last UPL in the series. The comparison controller is adapted to perform a test for defects in the data and to provide a result of the test to the pad during a test mode, whereby the presence or absence of defects in the DQ block is verified in synchronization with an edge of a clock signal.

20 Claims, 6 Drawing Sheets

SEMICONDUCTOR MEMORY DEVICE CAPABLE OF REDUCING DATA TEST TIME IN PIPELINE

TECHNICAL FIELD

The present invention relates generally to semiconductor memory devices and, in particular, to a semiconductor memory device capable of reducing a data test time in a pipeline.

BACKGROUND DESCRIPTION

A semiconductor memory device is composed of a large number of memory cells. When one of these memory cells does not operate normally, the memory device cannot perform its proper function. Moreover, as the integration density of semiconductor memory devices increases, the probability of abnormal operation of memory cells also increases. Accordingly, semiconductor memory devices are tested to sort out defective cells. A bit-by-bit test method and a parallel bit test method have been proposed for testing semiconductor memory devices.

Figure 1:
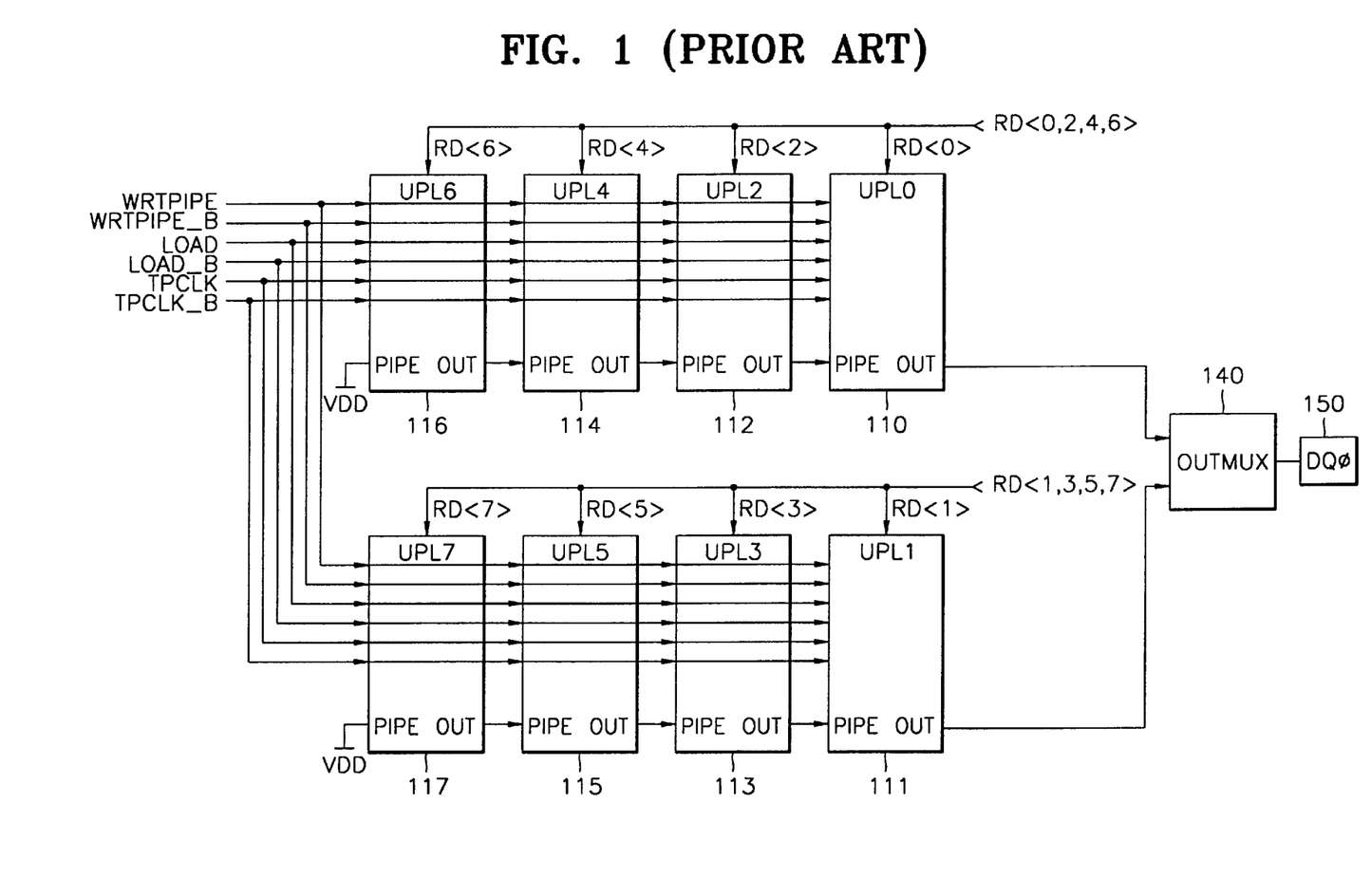
FIG. 1 is a diagram illustrating a pipeline in a semiconductor memory, according to the prior art.

Meanwhile, to improve the performance and increase the speed of semiconductor memory devices, Rambus Dynamic Random Access Memories (DRAMs) have been developed. A Rambus DRAM reads from an entire memory cell array at once, storing a large amount of data and outputting the data at high speed in synchronization with a clock signal. This data transmission is implemented using a pipeline. FIG. 1 is a diagram illustrating a pipeline in a semiconductor memory, according to the prior art.

In the pipeline of FIG. 1, a plurality of unit pipeline cells (UPLs) 110 through 117 (hereinafter collectively referred to as "UPLs 110–117") are connected in series. Each of the plurality of UPLs 110–117 transmits stored data to the succeeding UPL stage and latches data from the preceding UPL stage in response to control signals WRTPIPE, WRTPIPE_B, LOAD and LOAD_B and clock signals TPCLK and TPCLK_B. The signals WRTPIPE_B, LOAD_B and TPCLK_B are the inverted signals of the signals WRTPIPE, LOAD and TPCLK, respectively. In this pipeline, data RD<0> through RD<7> (hereinafter collectively referred to as "RD<0>–RD<7>") of predetermined data bits are sequentially transmitted to a pad DQ0 via the UPL stages.

Figure 2:
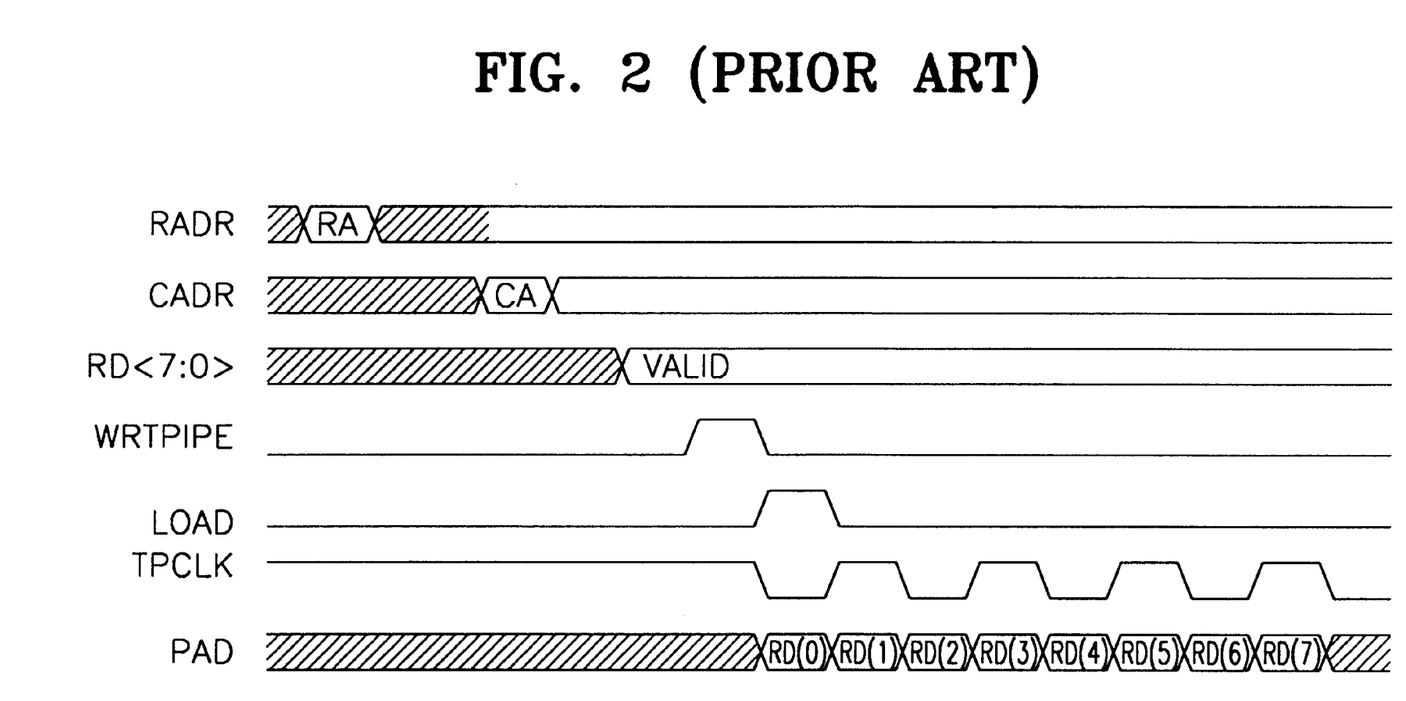
FIG. 2 is a timing diagram of some of the signals corresponding the operation of the pipeline of FIG. 1.

FIG. 2 is a timing diagram of some of the signals corresponding the operation of the pipeline of FIG. 1. Similar to the operation of a typical DRAM, data is read from memory cells corresponding to activated row and column addresses RADR and CADR, respectively, and applied to a data line RD<7:0>. During a pipeline data read operation in response to a binary logic "low" pipeline write signal WRTPIPE and a preceding stage data latch signal LOAD, read memory cell data RD<0>–RD<7> are sequentially output in synchronization with the clock signal TPCLK.

However, in the pipeline, output data cannot be tested for defective values until all the data is output in response to the clock signal TPCLK. In other words, the test is performed in bit units. Accordingly, eight edges of the clock signal TPCLK are required for testing the eight data RD<0>–RD<7>. Rambus DRAMs having a pipeline are composed of a plurality of data lines, so a large number of cycles of the clock signal TPCLK are required for testing one Rambus DRAM. Consequently, the time required to perform a test is undesirably long. Since several million Rambus DRAMs are produced per month, a large amount of time is required to test the same. A long test time increases the cost associated with manufacturing the Rambus DRAMs, as well as decreasing productivity.

Accordingly, it would be desirable and highly advantageous to have a semiconductor memory device capable of reducing the test time of a pipeline therein.

SUMMARY OF THE INVENTION

The problems stated above, as well as other related problems of the prior art, are solved by the present invention, a semiconductor memory device capable of reducing the test time of a pipeline therein.

According to a first aspect of the invention, a semiconductor memory device is provided. The semiconductor to memory device has a pad, data lines, and a data port (DQ) block including a plurality of memory cells. The semiconductor memory device includes a pipeline adapted to output data from selected memory cells of the plurality of memory cells in the DQ block to the pad via the data lines. The pipeline includes a plurality of unit pipeline cells (UPLs) connected in a series. Each of the UPLs is further connected to each of the data lines and is adapted to latch the data, wherein the data is transmitted to a subsequent UPL in the series, if any, so as to sequentially transmit the data to the pad. A comparison controller is connected to a last UPL in the series. The comparison controller is adapted to perform a test for defects in the data and to provide a result of the test to the pad during a test mode, whereby the presence or absence of defects in the DQ block is verified in synchronization with an edge of a clock signal.

According to a second aspect of the invention, a semiconductor memory device is provided. The semiconductor memory device has a pad, a first group of data lines, a second group of data lines, and at least a first and a second data port (DQ) block including a first and a second plurality of memory cells. The semiconductor memory device includes a first pipeline set adapted to output first data from first selected memory cells of the first plurality of memory cells in the first DQ block to the pad via the first group of data lines. The first pipeline set includes a first plurality of unit pipeline cells (UPLs) connected in a first series. Each of the first plurality of UPLs is further connected to each of the first group of data lines and is adapted to latch the first data, wherein the first data is transmitted to a subsequent UPL in the first series, if any, so as to sequentially output the first data to the pad. A second pipeline set is adapted to output second data from second selected memory cells of the second plurality of memory cells in the second DQ block to the pad via the second group of data lines. The second pipeline set includes a second plurality of UPLs connected in a second series. Each of the second plurality of UPLs is further connected to each of the second group of data lines and is adapted to latch the second data, wherein the second data is transmitted to a subsequent UPL in the second series, if any, so as to sequentially output the second data to the pad. A first comparison controller is connected to a last UPL in the first series. The first comparison controller is adapted to test the first data to provided from the first DQ block via the first group of data lines for defects during a test mode. A second comparison controller is connected to a last UPL in the second series. The second comparison controller is adapted to test the second data provided from the second DQ block via the second group of data lines for the defects during the test mode.

When the data on the data lines of a DQ block are tested for defects in the pipeline, the invention requires only one edge of a clock signal due to a structure in which the comparison controller is connected to the last stage of the pipeline, thereby significantly reducing the test time. In addition, the invention can test the data of two DQ blocks using one pad connected to the pipeline of one DQ block, thereby saving the driver of an external tester connected to the pad during the test. In this way, many pads can be saved, so that the drivers of a tester connected to the pads can be used for something else. Therefore, the invention increases the utility of the tester.

These and other aspects, features and advantages of the present invention will become apparent from the following detailed description of preferred embodiments, which is to be read in connection with the accompanying drawings.

DETAILED DESCRIPTION OF PREFERRED EMBODIMENTS

It is to be understood that the present invention may be implemented in various forms of hardware, software, firmware, special purpose processors, or a combination thereof. Preferably, the present invention is implemented as a combination of both hardware and software, the software being an application program tangibly embodied on a program storage device. The application program may be uploaded to, and executed by, a machine comprising any suitable architecture. Preferably, the machine is implemented on a computer platform having hardware such as one or more central processing units (CPU), a random access memory (RAM), and input/output (I/O) interface(s). The computer platform also includes an operating system and microinstruction code. The various processes and functions described herein may either be part of the microinstruction code or part of the application program (or a combination thereof) which is executed via the operating system. In addition, various other peripheral devices may be connected to the computer platform such as an additional data storage device.

It is to be further understood that, because some of the constituent system components depicted in the accompanying Figures may be implemented in software, the actual connections between the system components may differ depending upon the manner in which the present invention is programmed. Given the teachings herein, one of ordinary skill in the related art will be able to contemplate these and similar implementations or configurations of the present invention.

A general description of the present invention will now be provided to introduce the reader to the concepts of the invention. Subsequently, more detailed descriptions of various aspects of the invention will be provided with respect to FIGS. 3 through 6. In the Figures, the same reference numerals denote the same member.

Figure 3:
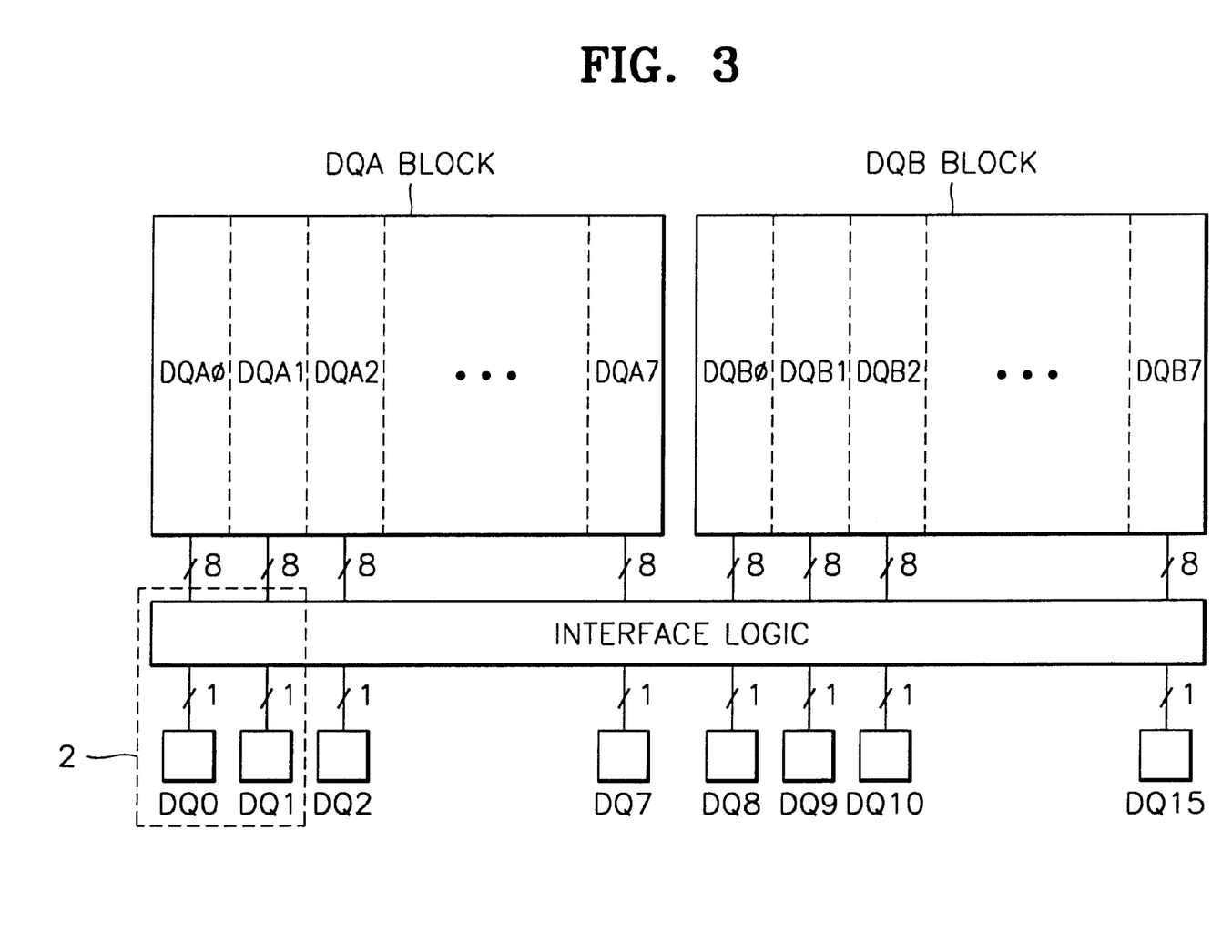
FIG. 3 is a diagram illustrating a semiconductor memory device having a pipeline according to an illustrative embodiment of the invention.

FIG. 3 is a diagram illustrating a semiconductor memory device having a pipeline 2 according to an illustrative embodiment of the invention. In the illustrative embodiment, the semiconductor memory device is a Rambus dynamic random access memory (DRAM). A Rambus DRAM generally includes a plurality of banks arranged in a row. Each bank includes DQ blocks that share a group of data lines in a column direction thereof. The Rambus DRAM shown in FIG. 3 includes two DQ block groups DQA and DQB. Each of the DQ block groups DQA and DQB includes eight DQ blocks, DQA0 through DQA7 or DQB0 through DQB7, respectively. Eight data lines provided from each of the DQ blocks DQA0 through DQA7 and DQB0 through DQB7 are connected by way of pipelining through interface logic. In general, the number of data lines provided from each of the DQ blocks DQA0 through DQA7 and DQB0 through DQB7 varies depending on the memory architecture of the Rambus DRAM.

Figure 4:
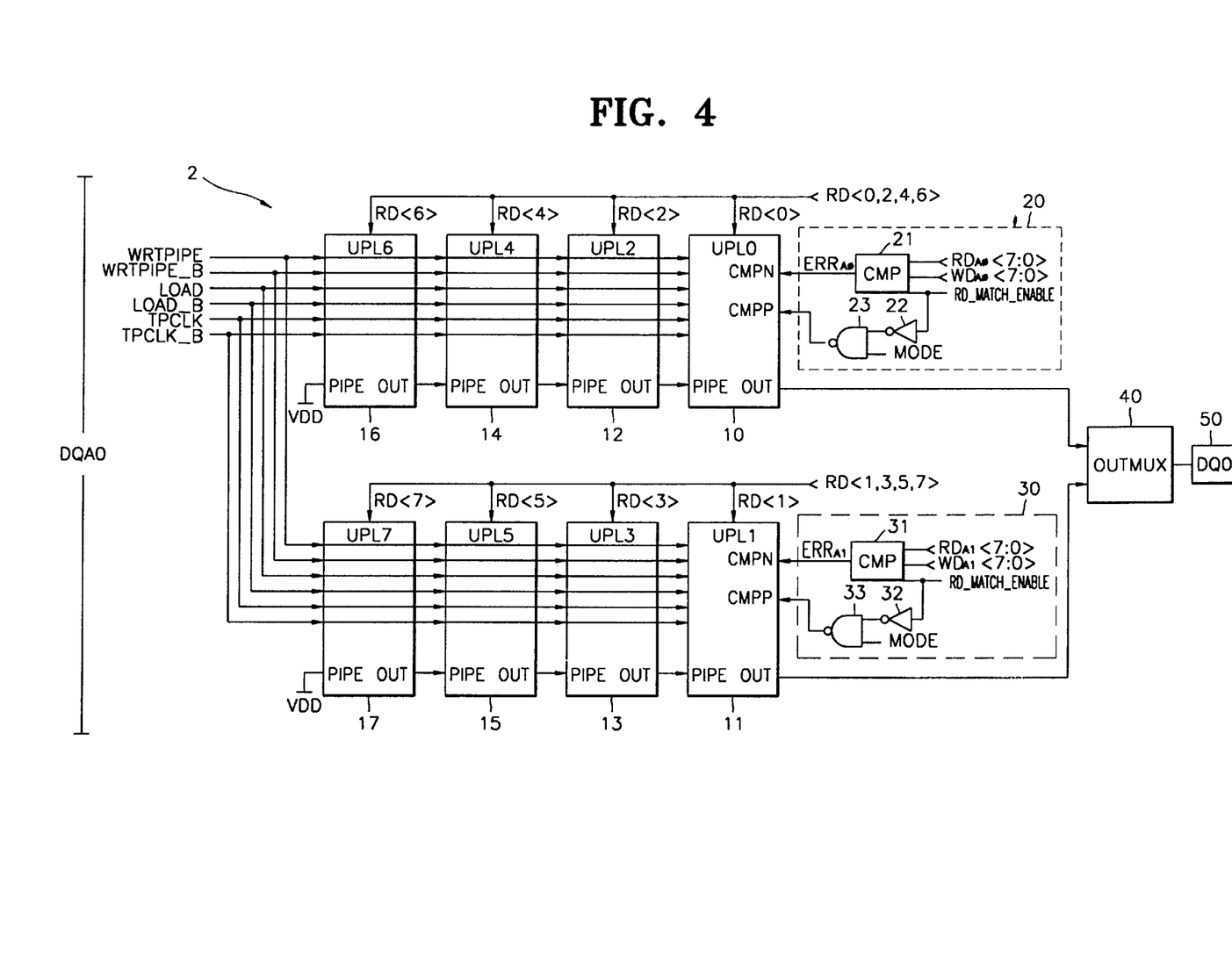
FIG. 4 is a diagram illustrating a pipeline corresponding to the DQA0 block in the interface logic of FIG. 3, according to an illustrative embodiment of the invention.

FIG. 4 is a diagram illustrating a pipeline 2 corresponding to the DQA0 block in the interface logic of FIG. 3, according to an illustrative embodiment of the invention. For simplicity, only one DQA0 block is described in the pipeline 2 of FIG. 4. Data read from memory cells selected in the DQA0 block is transmitted to the pipeline 2 via eight data lines RD<7:0>.

In the pipeline 2, a plurality of UPLs 10 through 17 (hereinafter collectively referred to as "UPLs 10–17"), each acting as a kind of data flip-flop, are connected in series. Each of the UPLs 10–17 latches the value of read memory cell data on each of the data lines RD<7:0> in response to control signals WRTPIPE, WRTPIPE_B, LOAD, LOAD_B, TPCLK and TPCLK_B. The plurality of UPLs 10–17 are classified into two groups: a first UPL group 10, 12, 14 and 16, which are connected to the even data lines RD<0>, RD<2>, RD<4> and RD<6>, respectively; and a second UPL group 11, 13, 15 and 17, which are connected to the even data lines RD<1>, RD<3>, RD<5> and RD<7>, respectively. UPL 10, which is positioned at the last stage of the first UPL group, and UPL 11, which is positioned at the last stage of the second UPL group, are connected to comparison controllers 20 and 30, respectively. The data output from UPLs 10 and 11 is transmitted to a pad 50 via an output multiplexer (OUTMUX) 40.

A typical pipeline operation is performed in the pipeline of FIG. 4, wherein data from a preceding stage is latched while existing data is transmitted to a succeeding stage in response to a clock signal, thereby sequentially outputting predetermined bits of data bit by bit. More specifically, in the first UPL group, the data of UPL 10 (which is directly connected to the OUTMUX 40) is output first, followed by the sequential output of data from UPLs 12, 14 and 16 in response to the clock signal TPCLK. In the same manner, in the second UPL group, the data of UPL 11 (which is directly connected to the OUTMUX 40) is output first, followed by sequential output of data from UPLs 13, 15 and 17 in response to the clock signal TPCLK.

The first UPL group 10, 12, 14, and 16 is triggered by the falling edge of the clock signal TPCLK, and the second UPL group 11, 13, 15 and 17 is triggered by the rising edge of the clock signal TPCLK. Thus, the OUTMUX 40 first outputs the data of UPL 10 and then sequentially outputs the data of UPLs 11, 12, 13, 14, 15, 16, and 17 to the pad 50 in response to the falling and rising edges of the clock signal TPCLK. This operation is the same as that described with respect to FIG. 2.

Referring back to FIG. 4, unlike UPLs 12, 14, 16, 13, 15 and 17 at the preceding stages, UPLs 10 and 11 at the last stages of the first and second UPL groups are connected to the comparison controllers 20 and 30, respectively. The comparison controller 20 compares write data $WD_{A0}<7:0>$ to be written to the DQA0 block with read data $RD_{A0}<7:0>$ read from the DQA0 block in a comparator (CMP) 21 in response to a comparative check enable signal RD_MATCH_ENABLE; the comparison controller 20 outputs an error signal $ERR_{A0}$ as a result of the comparison. The comparative check enable signal RD_MATCH_ENABLE is provided to one input of a 2-input NAND gate 23 via an inverter 22. A test mode signal MODE is provided to the other input of the 2-input NAND gate 23. The error signal $ERR_{A0}$ is provided to UPL 10 as a first comparison signal CMPN, and the output of the 2-input NAND gate 23 is provided to UPL 10 as a second comparison signal CMPP.

In the operation of the comparison controller 20, when the test mode signal MODE for testing data on the pipeline 2 is in a logic "low" state and the comparative check enable signal RD_MATCH_ENABLE is activated to a logic "high" state, the CMP 21 performs an XOR operation with respect to the write data $WD_{A0}<7:0>$ and the read data $RD_{A0}<7:0>$ and outputs a logic "low" error signal $ERR_{A0}$ when the write data $WD_{A0}<7:0>$ is the same as the read data $RD_{A0}<7:0>$. This means that the values of the data to be written to the memory cells have been written and read back from the memory cells without a change in any of the values; thus, none of the memory cells are considered to be defective.

On the other hand, when the write data $WD_{A0}<7:0>$ is different from the read data $RD_{A0}<7:0>$, the CMP 21 outputs a logic "high" error signal $ERR_{A0}$. In this case, one or more data values were wrongly written in memory cells or wrong data was read due to a malfunction. This means that there are defects in the memory cells or internal circuit operation. Thereafter, the error signal $ERR_{A0}$ is output to the pad 50 (DQ0) in synchronization with the falling edge of the clock signal TPCLK.

Accordingly, the comparison controller 20 directly outputs to the pad 50 the detection of defects in data provided from the DQA0 block to the data lines $RD_{A0}<7:0>$ without using the pipeline 2. In testing for defects in data on the data lines in the pipeline, the conventional technology requires eight clock edges for the bit-by-bit test as shown in FIG. 2. In contrast, the invention, in which the comparison controller 20 is connected to the last stage of the pipeline 2, requires only one clock edge. Therefore, the invention can significantly reduce the test time.

The operation of the comparison controller 30 connected to UPL 11 is almost the same as the operation of the comparison controller 20. The comparison controller 30 tests data provided from the DQA1 block while the comparison controller 20 tests data provided from the DQA0 block. The comparison controller 30 compares write data $WD_{A1}<7:0>$ to be written to the DQA1 block with read data $RD_{A1}<7:0>$ read from the DQA1 block in a comparator (CMP) 31 and outputs an error signal $ERR_{A1}$ as a result. The error signal $ERR_{A1}$ is transmitted to a pad DQ1 at the rising edge of the clock signal TPCLK.

The error signals $ERR_{A0}$ and $ERR_{A1}$ of the respective DQA0 and DQA1 blocks are transmitted to the pad 50 (DQ0) via the OUTMUX 40. Compared to a conventional pipeline in which the data of each DQ block is individually output and tested via each pad, the invention can test the data of the two DQA0 and DQA1 blocks using only one pad 50 (DQ0) and two comparison controllers. Therefore, the present invention does not require the driver of an external tester connected to a pad DQ1 during the test. In this way, many pads are saved, so that the drivers of a tester connected to the pads can be used for something else, thereby increasing the utility of the tester.

Figure 6:
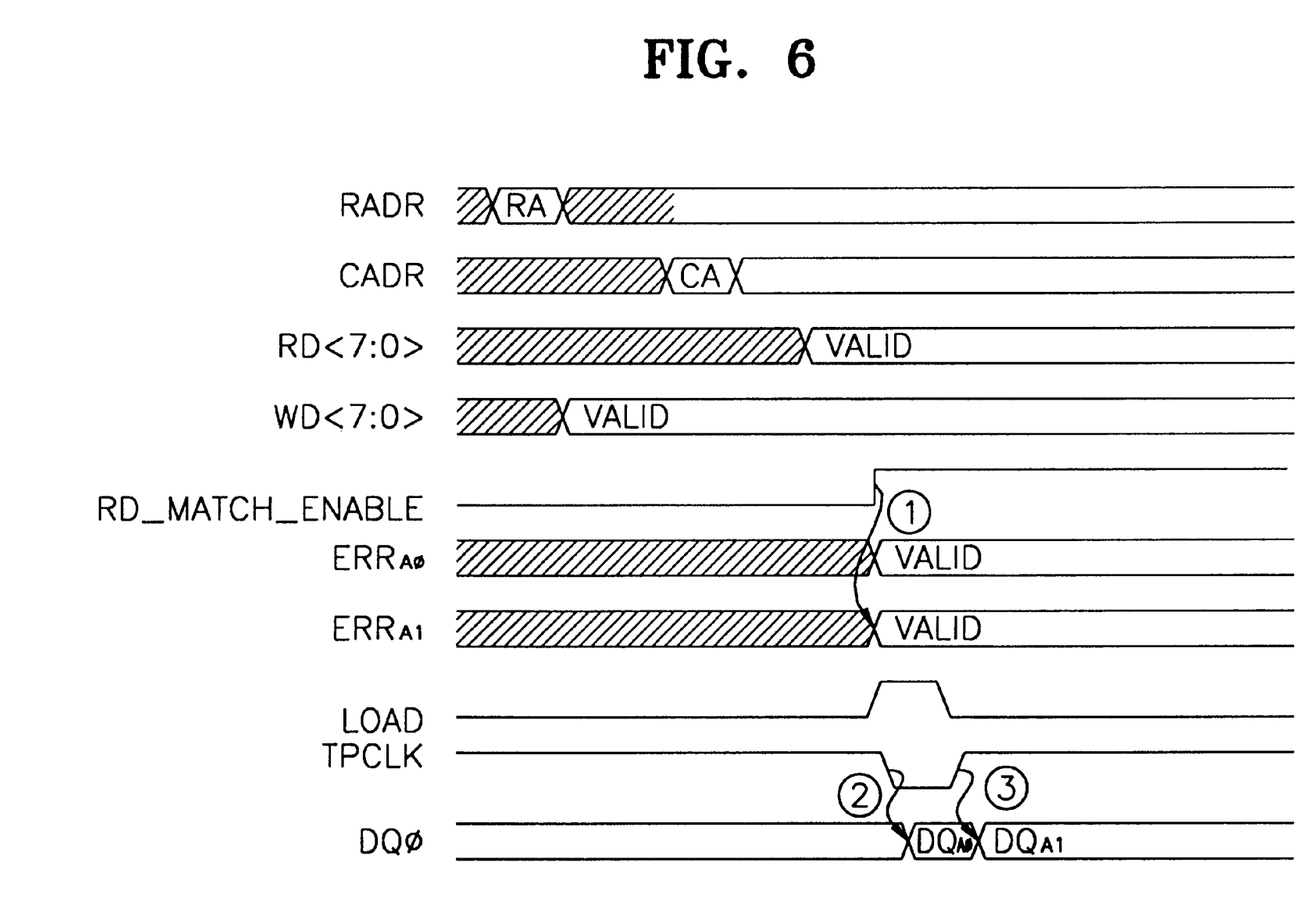
FIG. 6 is a timing diagram illustrating the operation of signals corresponding to the testing of the pipeline of FIG. 4, according to an illustrative embodiment of the invention.

FIG. 6 is a timing diagram illustrating the operation of signals corresponding to the testing of the pipeline 2 of FIG. 4, according to an illustrative embodiment of the invention. Like the operation of a typical DRAM, data WD<7:0> is written to memory cells corresponding to row and column addresses RADR and CADR, respectively, set in response to external control signals /RAS, /CAS, /WE, CLK and ADDR (not shown); data RD<7:0> stored in the corresponding memory cells is read. Thereafter, the error signal $ERR_{A0}$ of the DQA0 block and the error signal $ERR_{A1}$ of the DQA1 block are output in response to the switching of the comparative check enable signal RD_MATCH_ENABLE to a logic "high" state (①). Then, a logic state indicating the defect/non-defect of the DQA0 block and depending on the error signal $ERR_{A0}$ is transmitted to the pad DQ0 50 at the falling edge of the clock signal TPCLK (②); a logic state indicating the defect/non-defect of the DQA1 block and depending on the error signal $ERR_{A1}$ is transmitted to the pad DQ0 50 at the rising edge of the clock signal TPCLK (③).

Figure 5:
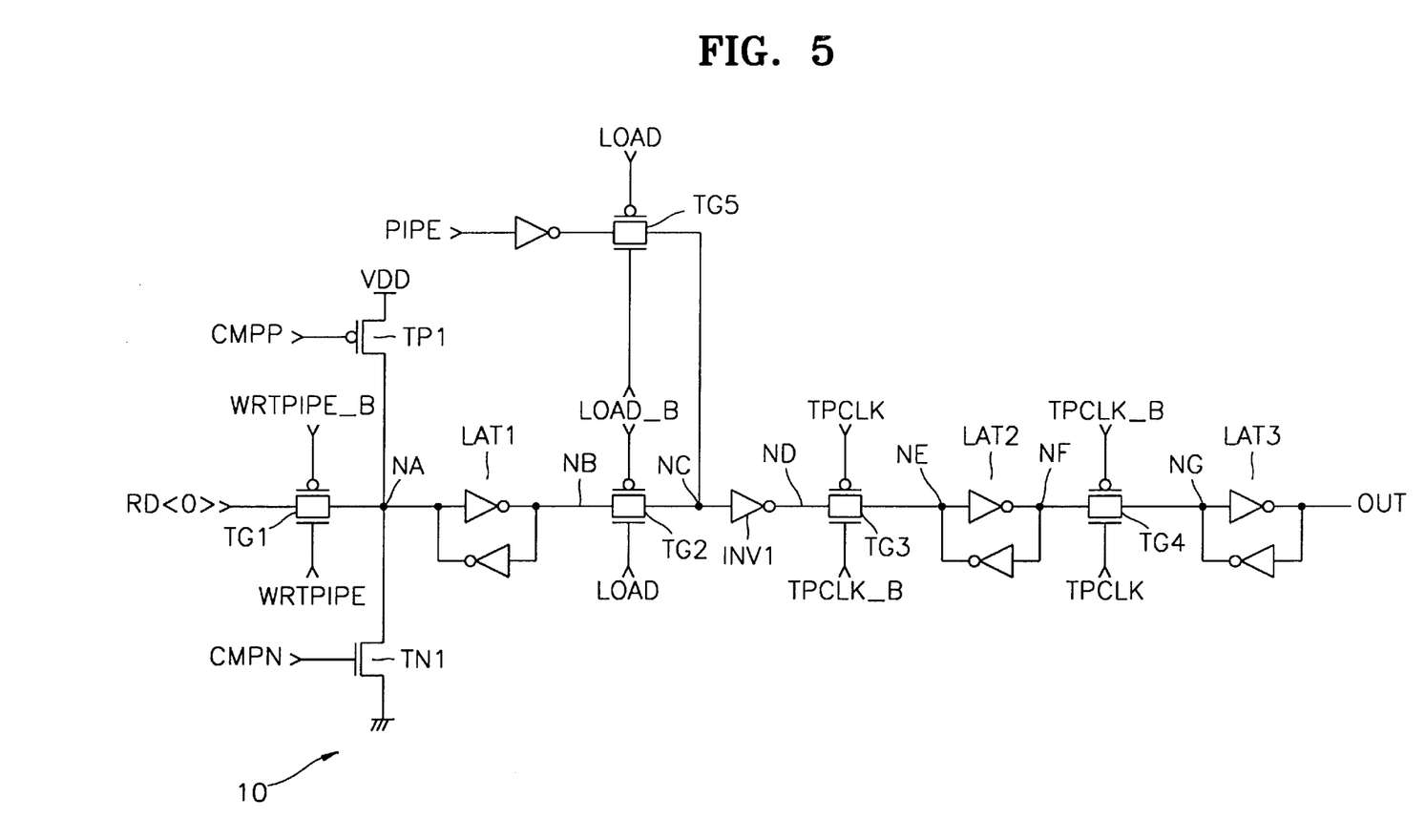
FIG. 5 is a diagram illustrating one of the unit pipeline cells (UPLs) of FIG. 4, according to an illustrative embodiment of the invention.

This operation will be described in detail with reference to FIG. 5, which is a diagram illustrating one of the unit pipeline cells (UPLS) of FIG. 4, according to an illustrative embodiment of the invention. In particular, FIG. 5 further illustrates UPL 10. UPL 10 outputs the data on the data line RD<0> or on the pipeline output PIPE (from UPL 12 at the previous stage) as an output signal OUT in response to the control signals WRTPIPE, WRTPIPE_B, LOAD, LOAD_B, TPCLK and TPCLK_B. During a test, UPL 10 outputs the detection or non-detection of data defects on the data line RD<0> of the DQA0 block in response to the first and second comparison signals CMPN and CMPP corresponding to the error signal $ERR_{A0}$ and the output of NAND gate 23, respectively.

In the operation of UPL 10 during the test, the second comparison signal CMPP becomes a logic "low" state in response to the switching of the test mode signal MODE to a logic "high" state and the switching of the comparative check signal RD_MATCH_ENABLE to a logic "low" state. Thus, a transistor TP1 is turned on, thereby precharging a node NA to a logic "high" state. The logic "high" state of the node NA is then output to the pad DQ0. In this way, the initialization for a pipeline test is performed.

Thereafter, the second comparison signal CMPP becomes a logic "high" state in response to the switching of the comparative check signal RD_MATCH_ENABLE to a logic "high" state and, thus, the transistor TP1 is turned off. The previous logic "high" state is maintained by a latch LAT1. Since a transistor TN1 is turned off by a logic "low" error signal $ERR_{A0}$ (indicating the absence of defects in the DQA0 block) provided by the CMP 21 of FIG. 4 in response to a logic "high" comparative check enable signal RD_MATCH_ENABLE, the node NA maintains the logic "high" state. The logic "high" state of the node NA is output as the signal OUT in response to the preceding stage data latch signal LOAD and the clock signal TPCLK. The logic "high" output signal OUT is transmitted to the pad DQ0 via the OUTMUX 40. Since the output signal OUT is still in the logic "high" state which is what is was set to during the initialization stage of the pipeline test, it is verified that the DQA0 block has no defects.

Alternately, when the transistor TN1 is turned on in response to the first comparison signal CMPN corresponding to a logic "high" error signal $ERR_{A0}$ (indicating that the DQA0 block has defects), the logic "high" state of the node NA is converted to a logic "low" state. The logic "low" state of the node NA is transmitted to the pad DQ0 as the output signal OUT in response to the preceding stage data latch signal LOAD and the clock signal TPCLK. The logic "low" state transmitted to the pad DQ0 corresponds to the inverted value of the logic "high" state which was set during the initialization of the pipeline test. Therefore, it is verified that the DQA0 block has defects.

In the pipeline operation of UPL 10, the data on the data line RD<0> is output as the output signal OUT in response to the switching of both the pipeline write signal WRTPIPE and the preceding stage data latch signal LOAD to a logic "high" state. More specifically, the data on the data line RD<0> is transmitted to the node NA via a transmission gate TG1 in response to a logic "high" pipeline write signal WRTPIPE. The node NA maintains the logic state of the data line RD<0> due to the latch LAT1, and the node NB has the inverted logic state of the node NA. The logic state of the node NB is transmitted to a node NC via a transmission gate TG2 in response to a logic "high" preceding stage data latch signal LOAD. At this time, since a transmission gate TG5 receiving the pipeline output PIPE is turned off, the pipeline output PIPE is not transmitted to the node NC. The logic state of the node NC is inverted by an inverter INV1 and transmitted to a node ND. Thereafter, the logic state of the node ND is transmitted to a node NE via a transmission gate TG3 in synchronization with the falling edge of the clock signal TPCLK. The logic state at the node NE and its inverted state at a node NF are latched by a latch LAT2. The logic state of the node NF is transmitted to a node NG via a transmission gate TG4 in synchronization with the rising edge of the clock signal TPCLK. While the logic state of the node NG is latched by a latch LAT3, the logic state of the node NG is inverted and output as the output signal OUT. Accordingly, UPL 10 outputs the data of the data line RD<0> as the output signal OUT in response to the switching of the pipeline write signal WRTPIPE and the preceding stage data latch signal LOAD to a logic "high" state and the rising edge of the clock signal TPCLK.

Subsequently, UPL 10 outputs the pipeline output PIPE from the preceding stage as the output signal OUT in response to the switching of the preceding stage data latch signal LOAD to a logic "low" state. More specifically, the transmission gate TG2 is turned on in response to a logic "low" preceding stage data latch signal LOAD, and the pipeline output PIPE is transmitted to the node NC. Although the data of the data line RD<0> is transmitted to the node NB via the transmission gate TG1 which is turned on in response to a logic "high" pipeline write signal WRTPIPE, the data of the data line RD<0> is not transmitted to the node NC since the transmission gate TG2 is turned off in response to the logic "low" preceding stage data latch signal LOAD. The pipeline output PIPE transmitted to the node NC is transmitted to the node ND via the inverter INV1. A signal at the node ND is transmitted to the node NF via the transmission gate TG3 in response to the falling edge of the clock signal TPCLK and the latch LAT2. A signal at the node NF is output as the output signal OUT via the transmission gate TG4 in response to the rising edge of the clock signal TPCLK and the latch LAT3. Accordingly, UPL outputs the pipeline output PIPE provided from the preceding stage as the signal OUT in response to the switching of the preceding stage data latch signal LOAD to the logic "low" state.

Concisely, UPL 10 of the first UPL group outputs the data on the data line RD<0>, which is latched in response to the logic "high" pipeline write signal WRTPIPE, as the output signal OUT in response to the rising edge of the clock signal TPCLK when the preceding data latch signal LOAD is a logic "high" state. On the other hand, UPL 10 outputs the pipeline output PIPE as the signal OUT in response to the rising edge of the clock signal TPCLK when the preceding data latch signal LOAD is a logic "low" state. The same operation is performed in UPLs 12, 14 and 16 which, together with UPL 10, constitute the first UPL group.

UPLs 11, 13, 15 and 17, which constitute the second UPL group, operate in a similar manner to UPLs 10, 12, 14 and 16 of the first group. However, UPLs 11, 13, 15 and 17 in the second UPL group output data on the data lines RD<1>, RD<3>, RD<5> and RD<7> or pipeline output PIPE in response to the falling edge of the clock signal TPCLK. Thus, a detailed description of the operations of UPLs 11, 13, 15 and 17 is omitted to avoid redundancy. Concisely, UPLs 11, 13, 15 and 17 output the data of the data lines RD<1>, RD<3>, RD<5> and RD<7>, which is latched in response to the logic "high" pipeline write signal WRTPIPE, as the output signal OUT in response to the falling edge of the clock signal TPCLK when the preceding stage data latch signal LOAD is a logic "high" state. Alternately, UPLs 11, 13, 15 and 17 output the pipeline output PIPE provided from the UPL at the preceding stage as the output signal OUT in response to the falling edge of the clock signal TPCLK when the preceding stage data latch signal LOAD is a logic "low" state. Accordingly, the operation performed in a typical pipeline as shown in FIG. 2 is also performed in the pipeline of the invention.

Although the illustrative embodiments have been described herein with reference to the accompanying drawings, it is to be understood that the present system and method is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A semiconductor memory device having a pad, data lines, and a data port (DQ) block including a plurality of memory cells, the semiconductor memory device comprising:

a pipeline adapted to output data from selected memory cells of the plurality of memory cells in the DQ block to the pad via the data lines, said pipeline including a plurality of unit pipeline cells (UPLs) connected in a series, each of the UPLs being further connected to each of the data lines and adapted to latch the data, wherein the data is transmitted to a subsequent UPL in the series, if any, so as to sequentially transmit the data to the pad; and    a comparison controller connected to a last UPL in the series, said comparison controller adapted to perform a test for defects in the data and to provide a result of the test to the pad during a test mode,    whereby one of a presence and an absence of the defects in the DQ block is verified in synchronization with an edge of a clock signal.

2. The semiconductor memory device of claim 1, wherein said comparison controller is further adapted to compare data to be written to the selected memory cells against data read from the selected memory cells.

3. The semiconductor memory device of claim 1, wherein the result of the test is output from said comparison controller to the last UPL in the series, and the last UPL in the series provides an output signal corresponding to the result to the pad.

4. The semiconductor memory device of claim 3, wherein, during the test mode, the last UPL in the series is adapted to invert a logic state of the output signal to indicate the presence of defects in the DQ block, based upon the result.

5. The semiconductor memory device of claim 4, wherein the result of the test comprises an error signal corresponding to a comparison of data to be written to the selected memory cells with data read from the selected memory cells, the error signal being provided to the last UPL in the series.

6. The semiconductor memory device of claim 4, wherein the output signal is set at an initialization of the test.

7. The semiconductor memory device of claim 1, wherein the semiconductor memory device is a Rambus dynamic random access memory (DRAM) semiconductor device.

8. A semiconductor memory device having a pad, a first group of data lines, a second group of data lines, and at least a first and a second data port (DQ) block including a first and a second plurality of memory cells, the semiconductor memory device comprising:
   a first pipeline set adapted to output first data from first selected memory cells of the first plurality of memory cells in the first DQ block to the pad via the first group of data lines, said first pipeline set including a first plurality of unit pipeline cells (UPLs) connected in a first series, each of the first plurality of UPLs being further connected to each of the first group of data lines and adapted to latch the first data, wherein the first data is transmitted to a subsequent UPL in the first series, if any, so as to sequentially output the first data to the pad;
   a second pipeline set adapted to output second data from second selected memory cells of the second plurality of memory cells in the second DQ block to the pad via the second group of data lines, said second pipeline set including a second plurality of UPLs connected in a second series, each of the second plurality of UPLs being further connected to each of the second group of data lines and adapted to latch the second data, wherein the second data is transmitted to a subsequent UPL in the second series, if any, so as to sequentially output the second data to the pad;
   a first comparison controller connected to a last UPL in the first series, the first comparison controller adapted to test the first data provided from the first DQ block via the first group of data lines for defects during a test mode; and
   a second comparison controller connected to a last UPL in the second series, the second comparison controller adapted to test the second data provided from the second DQ block via the second group of data lines for the defects during the test mode.

9. The semiconductor memory device of claim 8, further comprising an output multiplexer for transmitting to the pad an output of the first comparison controller in synchronization with an edge of a clock signal and an output of the second comparison controller in synchronization with a next edge of the clock signal.

10. The semiconductor memory device of claim 8, wherein the first comparison controller is further adapted to compare data to be written to the first selected memory cells against data read from the first selected memory cells, and the second comparison controller is further adapted to compare data to be written to the second selected memory cells against data read from the second selected memory cells.

11. The semiconductor memory device of claim 8, wherein, during the test mode, the last UPL in the first series is adapted to invert a logic state of a first output signal provided to the pad to indicate a presence of defects in the first DQ block in response to a first error signal provided from the first comparison controller, and the last UPL in the second series is adapted to invert a logic state of a second output signal provided to the pad to indicate a presence of defects in the second DQ block in response to a second error signal provided from the second comparison controller.

12. The semiconductor memory device of claim 11, wherein the output signals are set at an initialization of the test.

13. The semiconductor memory device of claim 8, wherein one of the first and the second group of data lines is composed of even numbered data lines, and another of the first and the second group of data lines is composed of odd numbered data lines.

14. The semiconductor memory device of claim 8, wherein the semiconductor memory device is a Rambus dynamic random access memory (DRAM) semiconductor device.

15. A semiconductor memory device having a pad, data lines, a pipeline, and a data port (DQ) block including a plurality of memory cells, the pipeline adapted to output data from some of the plurality of memory cells in the DQ block to the pad via the data lines, the semiconductor memory device comprising:
   a plurality of unit pipeline cells (UPLs) comprised in the pipeline and connected in a series, each of the UPLs being further connected to each of the data lines and adapted to latch the data from a preceding UPL, if any, and to transmit the data to a subsequent UPL, if any; and
   a comparison controller connected to a last UPL in the series, said comparison controller adapted to perform a test for defects in the data and to provide a result of the test to the last UPL in the series during a test mode,
   whereby the last UPL in the series indicates to the pad, in synchronization with a single edge of a clock signal, one of a presence and an absence of defects in the DQ block based upon the result.

16. The semiconductor memory device of claim 15, wherein said comparison controller is further adapted to compare data to be written to the selected memory cells against data read from the selected memory cells.

17. The semiconductor memory device of claim 15, wherein, during the test mode, the last UPL in the series is adapted to invert a logic state of an output signal provided to the pad to indicate the presence of defects in the DQ block, in response to an error signal provided by said comparison controller.

18. The semiconductor memory device of claim 17, wherein the output signal is set at an initialization of the test.

19. The semiconductor memory device of claim 15, wherein the semiconductor memory device is a Rambus dynamic random access memory (DRAM) semiconductor device.

20. The semiconductor memory device of claim 15, wherein
   the pipeline comprises a first and a second pipeline set, the plurality of UPLs comprise a first and a second plurality of UPLs comprised in the first and the second pipeline set, respectively, the first and the second plurality of UPLs connected in a first and a second series, respectively, the data comprises a first and a second data, the group of data lines comprises a first and a second group of data lines, the DQ block comprises a first and a second DQ block, the plurality of memory cells comprises a first and a second plurality of memory cells comprised in the first and the second DQ block, respectively, the first pipeline set is adapted to sequentially output the first data from first selected memory cells of the first plurality of memory cells to the pad via the first group of data lines, the second pipeline set is adapted to sequentially output the second data from second selected memory cells of the second plurality of memory cells to the pad via the second group of data lines, said comparison controller comprises a first and a second comparison controller connected to a last UPL in the first and the second series, respectively, the first comparison controller is adapted to test the first data provided from the first DQ block via the first group of data lines for defects during the test mode, and the second comparison controller is adapted to test the second data provided from the second DQ block via the second group of data lines for the defects during the test mode.

* * * * *